United States Patent [19]

Boland et al.

[11] Patent Number: 4,649,630

[45] Date of Patent: Mar. 17, 1987

[54] PROCESS FOR DIELECTRICALLY ISOLATED SEMICONDUCTOR STRUCTURE

[75] Inventors: Bernard W. Boland; Paul W. Sanders, both of Scottsdale, Ariz.

[73] Assignee: Motorola, Inc., Schaumburg, Ill.

[21] Appl. No.: 718,255

[22] Filed: Apr. 1, 1985

[51] Int. Cl.[4] ............................................. H01L 21/76
[52] U.S. Cl. ................................. 29/580; 29/576 W; 29/578; 29/576 B; 148/1.5; 148/DIG. 85; 148/DIG. 43; 148/175; 148/DIG. 122
[58] Field of Search ............... 29/571, 576 B, 576 W, 29/578, 580, 577, 577 C; 148/1.5, DIG. 97, DIG. 122, DIG. 135, DIG. 85, DIG. 43, 175; 357/49, 55, 59, 54; 156/647, 648, 649

[56] References Cited

U.S. PATENT DOCUMENTS

| | | | |
|---|---|---|---|
| 3,412,295 | 11/1968 | Grebene | 29/576 W |
| 3,587,166 | 6/1971 | Alexander et al. | 29/577 |
| 3,614,558 | 10/1971 | LeCan et al. | 357/49 |
| 3,769,562 | 10/1973 | Bean | 148/DIG. 135 X |
| 3,834,958 | 9/1974 | Bean et al. | 148/DIG. 135 X |
| 3,871,007 | 3/1975 | Wakamiya et al. | 148/DIG. 135 X |
| 3,954,522 | 5/1976 | Roberson | 357/49 X |
| 4,004,046 | 1/1971 | Price | 148/DIG. 135 X |
| 4,290,831 | 9/1981 | Ports et al. | 148/DIG. 135 X |

OTHER PUBLICATIONS

Lee, F. H., "Dielectrically Isolated Saturating Circuits" in *IEEE* Transactions on Electron Devices, vol. ED-15, No. 9, Sep. 1968, pp. 645-650.
Abbas "Recessed Oxide Isolation Process", IBM Tech. Disc. Bul., vol. 20, No. 1, Jun. 1977, pp. 144-145.
Boag et al. "Optimized Thickness of Silicon Nitrides Silicon Oxide Dielectric—" IBM Tech. Disc. Bul., vol. 20, No. 3, Aug. 1977, pp. 1010-1011.

*Primary Examiner*—Brian E. Hearn
*Assistant Examiner*—Tuan Quach
*Attorney, Agent, or Firm*—Joe E. Barbee; John A. Fisher

[57] ABSTRACT

A process is disclosed for controllably providing dielectrically isolated semiconductor regions having a uniform and well defined thickness. Grooves are formed in a first surface of a semiconductor substrate and then a dielectric layer is formed covering that surface and the grooves extending into the surface. A layer of backing material such as polycrystalline silicon is formed overlying the dielectric layer. A semiconductor substrate is then thinned to form a new surface with portions of the dielectric layer and backing material exposed at that surface. A semiconductor layer is epitaxially grown overlying the new surface with the semiconductor layer having a monocrystalline structure where it is grown on exposed regions of the original substrate and having a polycrystalline structure otherwise. An oxidation masking layer is formed overlying those portions of the semiconductor layer which have a monocrystalline structure. Those portions of the semiconductor layer which are not covered by the oxidation masking layer are then oxidized to form an oxide extending through the semiconductor layer to the underlying dielectric layer. This oxide plus the original dielectric layer thus surround and isolate individual regions in which a portion of the original substrate has an epitaxial layer of semiconductor material grown thereon.

4 Claims, 11 Drawing Figures

PROCESS FOR DIELECTRICALLY ISOLATED SEMICONDUCTOR STRUCTURE

BACKGROUND OF THE INVENTION

This invention relates generally to a process for forming dielectrically isolated substrates, and more specifically to a process for forming dielectrically isolated substrates having controlled thickness and doping concentration and to a process for using such substrates in the fabrication of dielectrically isolated semiconductor devices.

Dielectrically isolated devices in which a layer of dielectric material, usually oxide, surrounds the edges and bottom of a semiconductor island, isolating it from adjacent semiconductor islands, are used for circuit applications requiring a high degree of electrical isolation between circuit components. Dielectrically isolated circuits are used, for example, where the circuit will be subjected to a radiation environment, where interdevice leakages must be kept very small, where parasitic coupling between devices must be minimized, or where individual devices may have to withstand high applied voltages. The technique of dielectric isolation between devices is used in those applications in which more isolation is required than can be achieved with junction isolation.

Dielectrically isolated circuit fabrication has generally been low yielding because of the process by which the dielectrically isolated substrates are obtained. The conventional dielectric isolation process begins with a single crystal silicon wafer of the resistivity and doping type necessary for fabricating the intended semiconductor devices. For example, the starting wafer is typically selected to form the collector region of bipolar transistors or the body region of MOS transistors to be used in the circuit. A heavily doped buried layer region is then formed on the wafer and grooves are etched into the wafer surface to separate device regions. The surface of the wafer including the grooves is oxidized and a thick layer of polycrystalline silicon is deposited on the oxide. Then, in a most critical step, most of the starting wafer is lapped away to leave only a thin layer of the starting material. This step required lapping away as much as 750–1000 microns of silicon to leave a layer only 1–5 microns in thickness. The shaping tolerance required in this operation results in a very low process yield. Typically the remaining silicon left after the lapping operation varies in thickness across a wafer so that the layer is too thick in some places and too thin or even nonexistant in other places. For bipolar transistors, the circuit result of this is that some transistors on a wafer have too high a collector resistance, some are not isolated from adjoining devices, and others are subject to a low breakdown voltage because of the thin collector region.

Attempts have been made to produce dielectrically isolated structures by a process which does not rely on a shaping operation to control critical thicknesses. One such attempt is disclosed in U.S. Pat. No. 3,587,166 and subsequently reported by Davidsohn et al. in an article entitled "Dielectric Isolated Integrated Circuit Substrate Processes", Proceedings of the IEEE, Vol. 57, September, 1969, pages 1532–1537. In the process disclosed, the shaping operation is relatively noncritical. The shaped substrate is masked with a patterned oxide mask, etched, an then refilled with epitaxial material. Unfortunately, growing high quality epitaxial material is difficult on the etched substrate. Difficulites include those inherent in epitaxial growth in small apertures in addition to the formation of an irregular disordered region at the edges of the oxide aperture. The latter results, in part, from an oxide lip which overhangs the etched region of the substrate.

The growth of epitaxial material in the etched regions also results in the deposition of polycrystalline material over the masking oxide. This polycrystalline material must be removed by lapping. Ultimately, therefore, the thickness of the resulting structure depends on both an etching step and on a lapping step. The tolerance of either of these limiting steps can easily exceed the permissible tolerances on layer thickness. Any lapping leads to nonuniformities across a wafer, especially on a wafer having a patterned oxide on the surface. The oxide is more resistance than the semiconductor material and causes a scouring or dishing of the semiconductor material.

Because of the many potential applications for dielectrically isolated circuits and for the need to reduce the cost of the circuits, a need existed for a process which would provide high yielding dielectrically isolated substrates and circuits fabricated on those substrates.

It is therefore an object of this invention to provide an improved process for controllably fabricating dielectrically isolated semiconductor regions.

It is another object of this invention to provide an improved process for fabricating dielectrically isolated circuit structures.

BRIEF SUMMARY OF THE INVENTION

The foregoing and other objects and advantages of the invention are achieved through a process in which the critically controlled semiconductor region is applied to the dielectrically isolated substrate in a planar layer after the thinning operation so that the thickness of that region is not controlled by the thinning operation and crystal quality is not compromised by restricted area growth. In one embodiment of the invention a heavily doped semiconductor substrate is provided with grooves extending into the surface to divide the surface into appropriate device regions. A dielectric layer is formed covering the substrate surface and grooves and a backing material such as polycrystalline silicon is formed overlying the dielectric layer. The original substrate is then thinned sufficiently to form a new surface exposing portions of the dielectric layer and possibly even the backing material. The resulting thickness of the remaining substrate material is not critical. Thereafter an epitaxial layer of semiconductor material of controlled thickness is deposited on the new surface. The critical thickness of this layer is determined by well-controlled epitaxial growth techniques, not by control of the thinning operation. The semiconductor material has a monocrystalline structure where it is grown on exposed portions of the substrate and has a polycrystalline structure otherwise. An oxidation masking layer is formed overlying those portions of the semiconductor layer having a monocrystalline structure; the remainder of the semiconductor layer is oxidized to grow an oxide extending through the semiconductor layer to the dielectric layer. Individual islands of the semiconductor layer having a controlled thickness are thus isolated from each other and from the backing material by the grown oxide in combination with the dielectric layer.

DETAILED DESCRIPTION OF PREFERRED EMBODIMENTS

FIGS. 1-13 illustrate process steps for fabricating dielectrically isolated semiconductor regions and dielectrically isolated devices in accordance with preferred embodiments of the invention. It is not intended, of course, that the invention be limited to these preferred embodiments.

Figure 1:
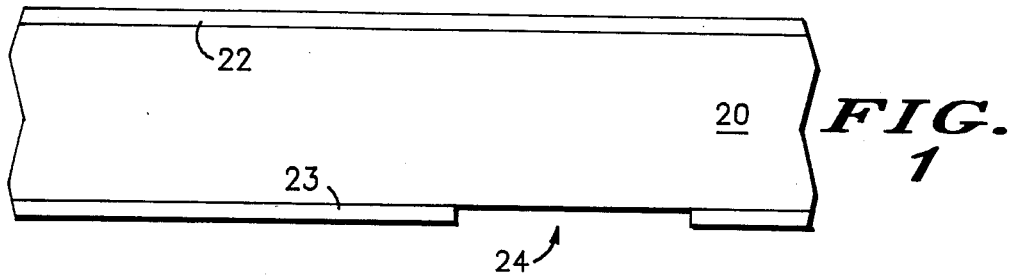
FIGS. 1-11 illustrate, in cross section, process steps for achieving dielectrically isolated semiconductor regions and device structures in accordance with the invention.

As is illustrated in FIG. 1, the process starts with a semiconductor substrate 20 which is provided with a masking layer on each surface. In accordance with a preferred embodiment, substrate 20 is a (100) oriented silicon substrate heavily doped with an N type dopant. The substrate is doped heavily enough to be considered N+ doped as that term is commonly used. Substrate 20 has a thickness greater than about 750 microns. A masking layer 22, 23 formed on the surfaces of substrate 20 is preferably thermally grown silicon dioxide. Oxide 23 on a first surface of the substrate is patterned to form an opening 24. In an actual device structure there are, of course, a plurality of openings 24 corresponding to the pattern of dielectric regions provided between and isolating regions of semiconductor material.

Figure 2:
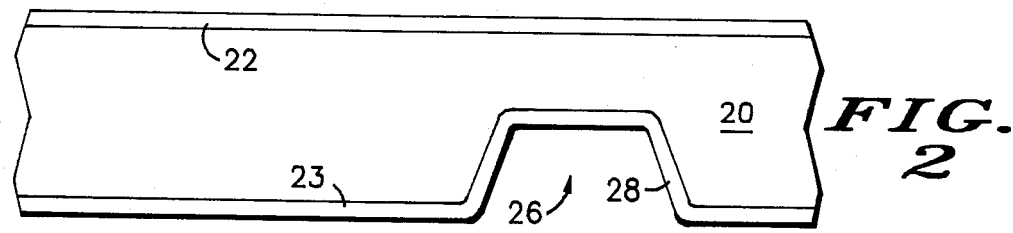

Using the patterned oxide 23 as an etch mask, grooves 26 are etched into the N+ substrate through openings 24 as illustrated in FIG. 2. Preferably the (100) silicon is etched in a solution of potassium hydroxide, water, and alchohol which etches V-shaped grooves 26 having well defined edges of known orientation. As illustrated in this embodiment, the etching is stopped before the full V-shaped is realized so that a flat bottom groove is achieved. The sloped edges of the groove aid in nucleating well controlled polycrystalline silicon growth in a subsequent process step. Following the groove etching, a dielectric layer 28 is formed covering the surface of the substrate and the etched grooves. Preferably the dielectric layer is formed by thermally oxidizing the silicon substrate to form a layer of silicon dioxide.

Figure 3:
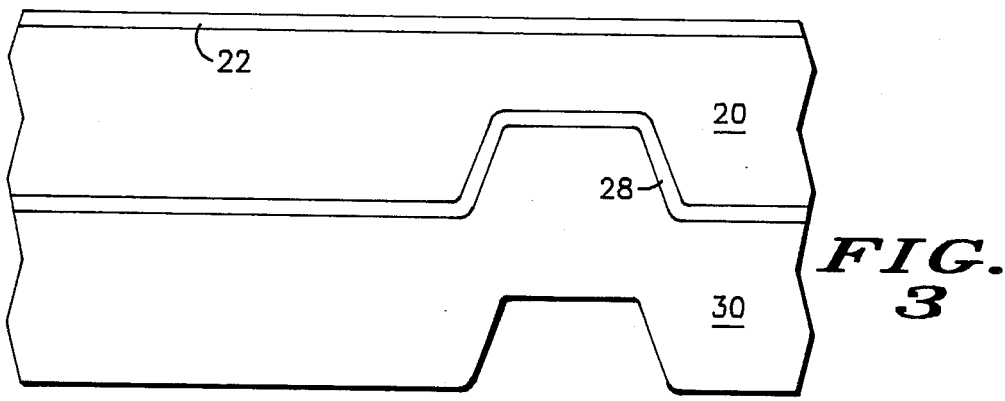

Following the formation of dielectric layer 28, a thick layer of backing material such as polycrystalline silicon 30 is deposited or otherwise formed overlying the dielectric layer as illustrated in FIG. 3. The backing material forms a physical support or "handle" for the eventual dielectrically isolated semiconductor structure. The backing material is deposited to a thickness of greater than about 750 microns.

In a preferred embodiment, the polycrystalline silicon contacting dielectric layer 28 is deposited as fine grained or amorphous material. The fine grained polycrystalline material insures the filing of the V-shaped grooves and avoids or minimizes selective growth on the shoulders of the grooves. The fine grained structure is obtained by depositing the polycrystalline silicon at a temperature of about 950° C.-1130° C. This low temperature deposition, however, can lead to warpage of the wafer. To avoid the warpage, the polycrystalline material deposition is done in two stages. The first low temperature stage provides the desired fine grain structure. In the second stage, the bulk of the polycrystalline material is deposited at about 1200° C. This results in larger grain size, but minimizes wafer warpage.

Figure 4:
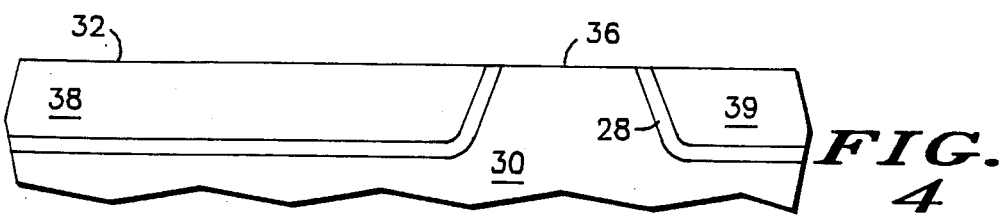

As illustrated in FIG. 4, the structure is shaped to achieve a planar structure. First, about 125-200 microns of the backing material is ground off to planarize the polycrystalline surface. Then the original N+ substrate 20 is shaped back by lapping and polishing to form a new surface 32. During the shaping process, the N+ substrate material is removed to expose portions of the dielectric layer 28 and even portions 36 of the backing material. The original substrate 20 has a thickness greater than about 750 microns, and most of this material is removed to leave islands 38, 39 of the original N+ material having a thickness of about 25±7 microns. Thus nearly 750-1000 microns of material is removed leaving a residue of only about 25±7 microns. In contrast to prior art processes, however, the shaping tolerance at this step is not critical. Some nonuniformity in the thickness of the remaining N+ regions 38, 39 will not affect the functioning of the final device. The only requirement is that the shaping be controlled enough so that each of the regions 38 be separated from each of the regions 39.

Figure 5:
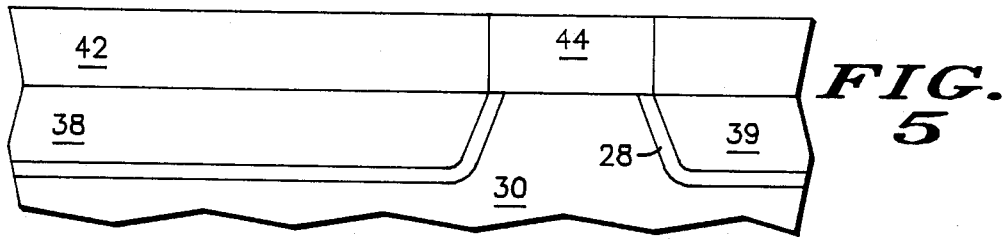

A semiconductor layer is next grown over on surface 32 as illustrated in FIG. 5. The portion 42 of the semiconductor layer which is deposited overlying N+ regions 38, 39 is epitaxial with regions 38, 39 and has a monocrystalline structure. Portion 44 which is deposited overlying backing material 36 and dielectric 28 has a polycrystalline structure because there is no single crystal material to nucleate monocrystalline growth. Control of the critical thickness of epitaxial layer 42 is dependent only upon the epitaxial growth conditions which can easily be controlled. The thickness of layer 42 is not dependent upon the shaping back of the original N+ substrate.

The thickness and doping of layer 42 are controlled, as necessary, in accordance with the type of device being fabricated. The layer can have a thickness, for example, between about one and ten microns and preferably is less than about six microns. For a high voltage transistor collector, for example, layer 42 can be doped N type to a resistivity of a few ohm centimeter and have a thickness of 4-6 microns. The N+ regions 38 serves as a buried layer or collector contact. The semiconductor layer is grown, for example, by the hydrgen reduction of silicon tetrachloride at a temperature of about 1025° C. The N type doping is achieved, for example, by adding precisely controlled amounts of phosphorous in the form of PH$_3$ to the reactant flow during the semiconductor growth.

The quality of the semiconductor layer is dependent on the quality of the surface upon which it is deposited. To achieve a high quality monocrystalline epitaxial layer, the surface of the islands 38, 39 must be finely polished and free of scratches. To achieve high quality polycrystalline material, the backing material 36 must be fine grained and highly polished. Growing semiconductor layer 44 on properly prepared fine grained polycrystalline material 36, at a temperature of about 1025° C. results in small grained polycrystalline silicon 44 which grows at almost the same rate as the epitaxial layer 42. Thus no polishing or lapping is necessary to planarize semiconductor layer 42, 44. A light polish may be necessary, occasionally, to remove spikes that grow in the polycrystalline material regions, but such polishing is minor and does not affect the quality or thickness of the critical device regions.

Figure 6:
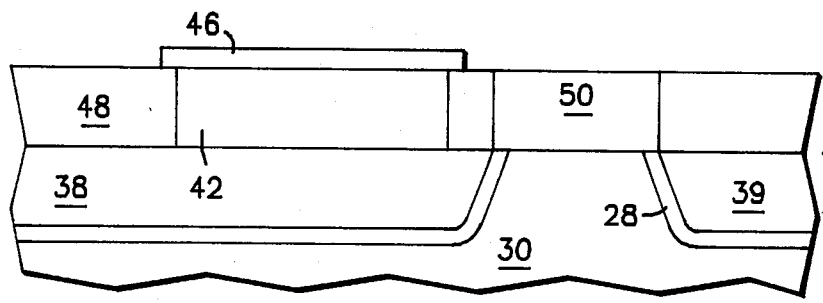

In accordance with a preferred embodiment of the invention, the planarized upper surface of the wafer is then thermally oxidized to grow a layer of silicon dioxide 46. Oxide layer 46 is patterned photolithographically to form a diffusion mask as illustrated in FIG. 6. Phosphorous is diffused into the semiconductor layer, both monocrystalline 42 and polycrystalline 44. The diffusion into monocrystalline silicon region 42 provides a low resistance contact 48 extending from the wafer surface to the N+ region 38. The phosphorous doped polycrystalline region 50 extends through the thickness of the polycrystalline silicon and serves to enhance the oxidation rate of the polycrystalline silicon. Region 48 is useful for forming a collector contact and can also be used as the bottom plate of a parallel plate capacitor if such a capacitor is needed, for example, as an interstage capacitor, in the circuit being fabricated.

Figure 7:
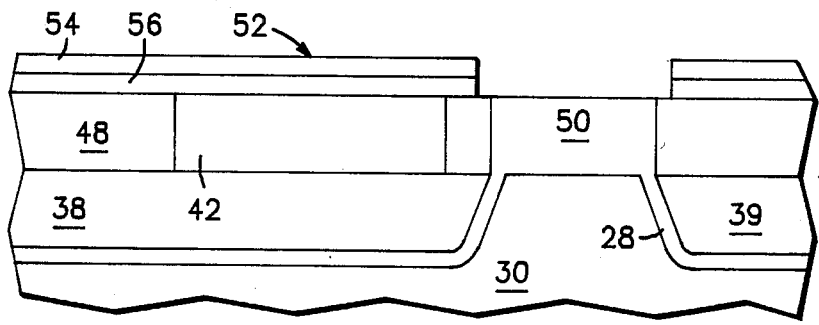

An oxidation masking layer 52 is next formed over the surface of the semiconductor layer and then patterned to expose the N+ doped polycrystalline silicon 50 as illustrated in FIG. 7. The oxidation masking layer can be, for example, a layer of silicon nitride 54 or a layer of silicon nitride overlying a layer of silicon dioxide 56. The layers of oxide and nitride can be formed, for example, by chemical vapor deposition, pyrolysis, or the like.

Figure 8:
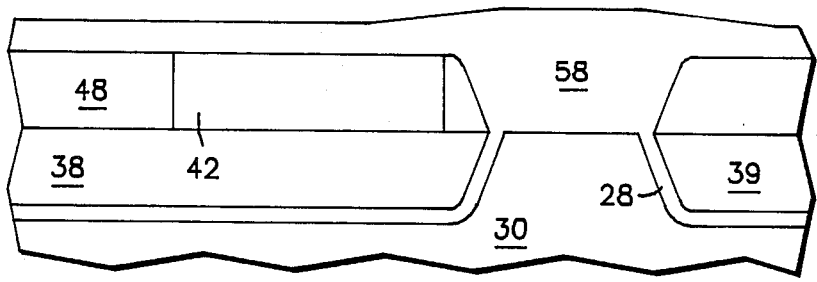
Figure 9:
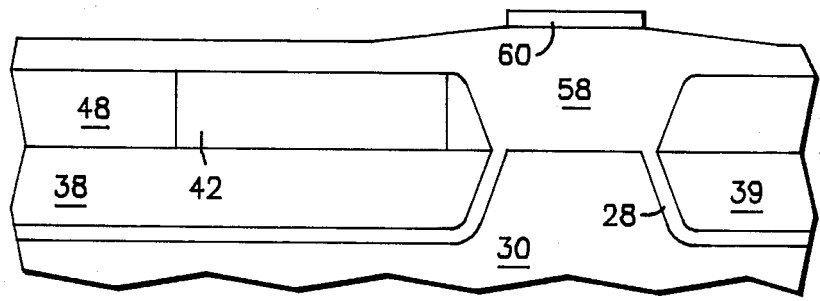
Figure 10:
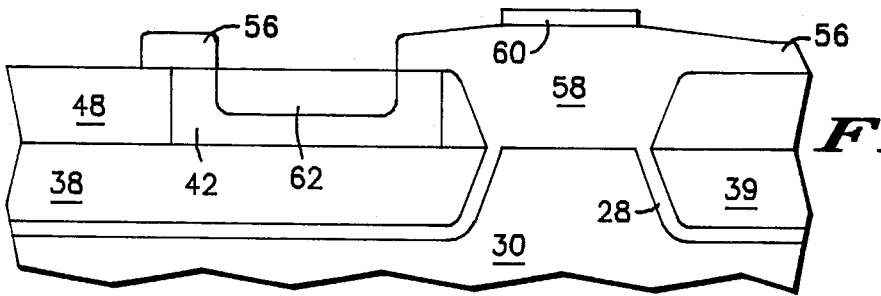
Figure 11:
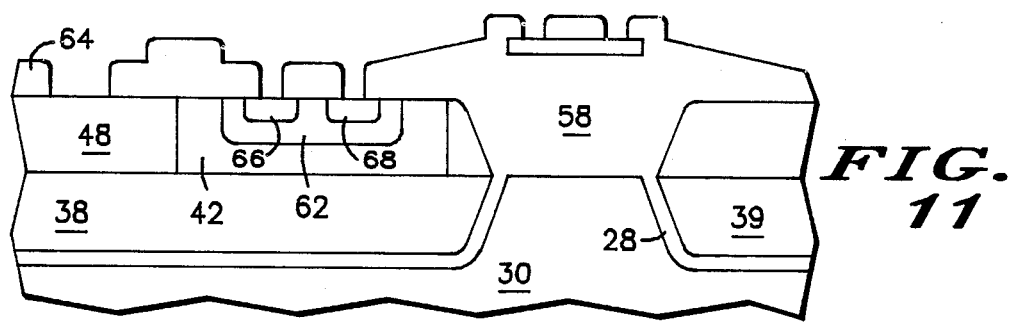

After patterning the oxidation masking layer 52, the structure is oxidized, preferably by a high pressure oxidation. The oxidation is continued until polycrystalline silicon 50 is completely oxidized to leave a silicon dioxide region 58 extending from the surface to the polycrystalline silicon backing material 30 as illustrated in FIG. 8. Oxide 58 thus extends through and separates the various regions of monocrystalline silicon. The region including N type epitaxial layer 42, N+ substrate 38, and N+ diffused region 48 is bounded by oxide 58 and dielectric layer 28. The combination of oxide layer 58 and dielectric layer 28 isolate semiconductor regions from each other and from the backing material 30. The fabrication of isolated semiconductor regions is thus completed. FIGS. 9-11 illustrate further steps for utilizing the isolated semiconductor regions in fabricating a dielectrically isolated circuit or structure. The steps illustrated are useful in fabricating a particular circuit; other or different steps may be necessary or useful in fabricating other device structure.

As illustrated in FIG. 9, a layer of polycrystalline silicon 60 is deposited on the surface of the structure and patterned to form a polycrystalline silicon resistor. Ideally the resistor is located on the isolating oxide 58 to both save space in the circuit and to isolate the resistor from other components. The polycrystalline silicon is deposited, for example, by low pressure chemical vapor deposition. The polycrystalline silicon layer is implanted to achieve the correct resistance value and then patterned photolithographically to the desired shape.

As illustrated in FIG. 10, oxide layer 56 is photolithographically patterned to expose a region located within N type monocrystalline silicon 42. This structure is implanted with a low dose of boron using an ion such as singly ionized $BF_2$ to form P type base region 62. The low dose $BF_2$ implant can be allowed to enter the polycrystalline resistor and N+ contact areas because the implant is two orders of magnitude lower in dopant concentration and the resultant compensation will be negligible.

As illustrated in FIG. 11, a layer of silicon oxide 64 is pyrolitically deposited on the surface of the structure and patterned to allow contact to the transistor base and emitter, the N+ collector contact and the bottom plate of the capacitor as well as to the ends of the polycrystalline silicon resistor. Photoresist is then successively used as an implant mask to selectively implant N type dopants to form the emitter 66 and base contacts 68, respectively. The layer of silicon oxide 64 also serves as a dielectric for a parallel plate capacitor.

A layer or layers of metallization (not shown) are then applied to the device and photolithographically patterned to form contacts to the device regions, to form the top plate of the capacitor, and to interconnect the various device structures of the integrated circuit.

The process, as described and illustrated above, is capable of providing dielectrically isolated substrates having a higher buried layer concentration than is attainable with prior art processes. In the conventional process the buried layer concentration is achieved by diffusion or epitaxial growth and is therefore limited to about $10^{19} cm^{-3}$. In the present process, the buried layer is derived from an as-grown crystal and the doping concentration is limited only by the solid solubility limit of the dopant material. The concentration can, therefore, be $1-2\times10^{20} cm^{-3}$ or higher depending on the dopant used. Because the N type epitaxial layer is applied after the deposition of the backing material, there is no problem of out diffusion of dopant from the buried layer during the long, high temperature deposition. Control of the doping of the epitaxial layer is thus markedly improved.

In the process in accordance with the invention, a planar layer of semiconductor material is deposited or grown on a planar substrate. The planar layer can be of excellent quality, in contrast to a layer formed in limited regions of a nonplanar structure. In addition, if the deposited semiconductor layer, for some reason, does not meet required specifications, the layer can be polished off and a new layer deposited. The expensive substrate can thus be reused to obtain material of the desired specification.

Thus it is apparent that there has been provided, in accordance with the invention, a process for controllably fabricating dielectrically isolated semiconductor regions and structures which fully meets objects and advantages set forth above. Although the invention has been described and illustrated with reference to specific embodiments thereof, it is not intended that the invention be limited to these illustrative embodiments. Those skilled in the art will recognize, after review of the foregoing description, that variations and modifications in the process are possible without departing from the spirit of the invention. Other device structures such as diodes, MOS transistors, and the like, for example, can be implemented. Other equivalent and similar methods for forming doped regions, deposited layers, and the like are also possible. It is therefore intended that all such variations and modifications be included within the scope of the appended claims.

We claim:

1. A process for controllably providing dielectrically isolated semiconductor regions which comprises the steps of: providing a semiconductor substrate having first and second surfaces; etching grooves in said first surface of said substrate; forming a layer comprising silicon dioxide covering said first surface and said grooves; forming a layer of backing material by depositing a quantity of polycrystalline silicon at a first temperature and then depositing a second quantity of polycrystalline silicon at a second temperature higher than said first temperature, said backing material overlying said layer comprising silicon dioxide; thinning said substrate by removing material from said second surface to form a new second surface exposing portions of said layer comprising silicon dioxide formed in said grooves and portions of said backing material; growing a semiconductor layer overlying said new second surface, said semiconductor layer having a monocrystalline structure where grown on exposed regions of said substrate and a polycrystalline structure otherwise; forming an oxidation masking layer over portions of said semiconductor layer having a monocrystalline structure; oxidizing portions of said semiconductor layer not covered by said oxidation masking layer to grow an oxide extending through said semiconductor layer to said portions of said backing material.

2. A process for controllably providing dielectrically isolated semiconductor regions which comprises the steps of: providing a semiconductor substrate having first and second surfaces; etching grooves in said first surface of said substrate; forming a dielectric layer covering said first surface and said grooves; forming a layer of backing material by depositing a quantity of polycrystalline silicon at a first temperature and then depositing a second quantity of polycrystalline silicon at a second temperature higher than said first temperature, said backing material overlying said dielectric layer; thinning said substrate by removing material from said second surface to form a new second surface exposing portions of said dielectric layer formed in said grooves; growing a semiconductor layer overlying said new second surface, said semiconductor layer having a monocrystalline structure where grown on exposed regions of said substrate and a polycrystalline structure otherwise; forming an oxidation masking layer over portions of said semiconductor layer having a monocrystalline structure; oxidizing portions of said semiconductor layer not covered by said oxidation masking layer to grow an oxide extending through said semiconductor layer to said portions of said backing material.

3. The process of claim 4 wherein said first temperature is about 950–1130 degrees Celsius.

4. The process of claim 3 wherein said second temperature is about 1200 degrees Celsius.

* * * * *